US005689461A

United States Patent [19]
Kaneko et al.

[11] Patent Number: 5,689,461
[45] Date of Patent: Nov. 18, 1997

[54] SEMICONDUCTOR MEMORY DEVICE HAVING VOLTAGE BOOSTER CIRCUIT COUPLED TO A BIT LINE CHARGING/EQUALIZING CIRCUIT OR SWITCH

[75] Inventors: Tetsuya Kaneko, Kawasaki; Takashi Ohsawa, Yokohama, both of Japan

[73] Assignee: Kabushiki Kaisha Toshiba, Kawasaki, Japan

[21] Appl. No.: 469,696

[22] Filed: Jun. 6, 1995

Related U.S. Application Data

[62] Division of Ser. No. 299,078, Sep. 1, 1994, abandoned.

[30] Foreign Application Priority Data

Sep. 10, 1993 [JP] Japan .................. 5-225336
May 30, 1994 [JP] Japan .................. 6-116761

[51] Int. Cl.$^6$ ............................................. G11C 7/00
[52] U.S. Cl. ............... 365/189.11; 365/203; 365/189.09; 365/228; 365/189.07; 365/230.03; 365/190; 365/207
[58] Field of Search .................. 365/189.11, 203, 365/189.09, 228, 189.07, 230.03, 190, 207, 208

[56] References Cited

U.S. PATENT DOCUMENTS 5,361,237 11/1994 Chishiki .................. 365/230.06

FOREIGN PATENT DOCUMENTS 0 092 809  11/1983  European Pat. Off. .
0 535 325   4/1993  European Pat. Off. .
2 118 795  11/1983  United Kingdom .

Primary Examiner—David C. Nelms
Assistant Examiner—Andrew Q. Tran
Attorney, Agent, or Firm—Banner & Witcoff, Ltd.

[57] ABSTRACT

An equalizing circuit is connected between a pair of bit lines. The equalizing circuit is made up of three MOS transistors and an equalization control signal is supplied to the gates of the MOS transistors. A sense amplifier circuit is connected to the bit lines. The sense amplifier circuit amplifies the potential difference occurring between the bit lines, for the detection of data. The equalization control signal is output from a level conversion circuit. An internal boosted voltage-generating circuit constantly generates a boosted voltage which is higher than an externally-applied power supply voltage applied to a power supply terminal. The boosted voltage is applied to the level conversion circuit. The level conversion circuit converts an input control signal, whose high-level voltage is equal to, or lower than the externally-applied power supply voltage, into the boosted voltage, thereby generating the equalization control signal.

16 Claims, 10 Drawing Sheets

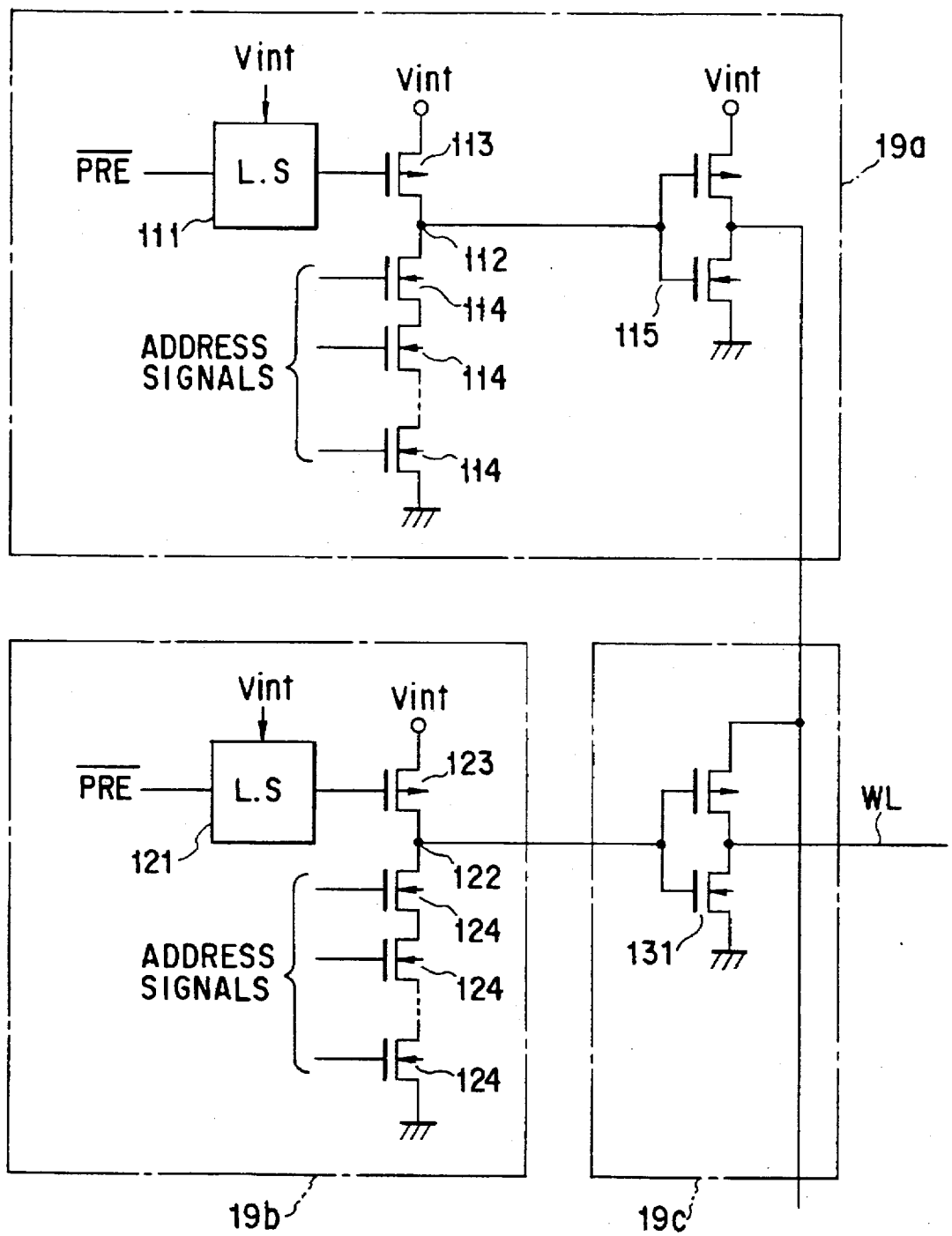
F I G. 13

SEMICONDUCTOR MEMORY DEVICE HAVING VOLTAGE BOOSTER CIRCUIT COUPLED TO A BIT LINE CHARGING/ EQUALIZING CIRCUIT OR SWITCH

This application is a division of application Ser. No. 08/299,078, filed Sep. 1, 1994, now abandoned.

BACKGROUND OF THE INVENTION

1. Field of the Invention

The present invention relates to a semiconductor memory device comprising a bit line-equalizing circuit which charges a pair of bit lines to predetermined potential levels and equalizes the potentials of the bit lines to each other before data is read out from a memory cell.

2. Description of the Related Art

In a dynamic random access memory (DRAM), an equalizing operation is performed before data is read out from a memory cell. The equalizing operation is an operation for charging a pair of bit lines to predetermined potential levels and then equalizing the potential levels to each other. In an ordinary case, the equalizing operation is performed by means of a bit line-equalizing circuit made up of N-channel MOS transistors.

FIG. 1 is a circuit diagram showing the peripheral circuit configuration of a bit line-equalizing circuit employed in a conventional DRAM. (The bit line-equalizing circuit will be hereinafter referred to simply as an "equalizing circuit".) Referring to FIG. 1, an equalizing circuit 14 is made up of three N-channel MOS transistors 11, 12 and 13 and is connected between a pair of bit lines BL and $\overline{BL}$. A sense amplifier circuit 15 for detecting data is also connected to the bit lines.

In the equalizing circuit 14, two MOS transistors 11 and 12 are turned on in response to an equalization control signal $\phi EQL$, and bit lines BL and $\overline{BL}$ are pre-charged in accordance with a pre-charging potential VBL. In response to the equalization control signal $\phi EQL$, MOS transistor 13 is also turned on. Since the bit lines BL and $\overline{BL}$ are short-circuited to each other by the ON-state MOS transistor 13, the potentials of the bit lines BL and $\overline{BL}$ are equalized to each other. After the equalizing circuit 14 sets the potential of the bit lines in this manner, data is read out from a memory cell (not shown). The potential difference which is produced between the bit lines BL and $\overline{BL}$ when the data is read out is amplified by the sense amplifier circuit 15, so as to detect the data.

In the conventional art, a signal whose level is equal to that of an externally-applied power supply voltage is used as the equalization control signal $\phi EQL$ supplied to the equalizing circuit 14. Alternatively, a signal whose level is temporarily raised by a known boot-strap circuit up to a level higher than that of the externally-applied power supply voltage is used as the equalization control signal $\phi EQL$. The reason why the voltage level of the equalization control signal $\phi EQL$ must be raised by means of the boot-strap circuit is that, if that voltage level is low, a potential difference is produced between the source and drain of each of the N-channel MOS transistors 11, 12 and 13, and this potential difference does not permit the bit line to be pre-charged to a predetermined potential level VBL.

FIG. 2 is a circuit diagram showing the peripheral circuit configuration of an equalizing circuit of another conventional DRAM. This DRAM is a so-called shared sense amplifier type wherein a sense amplifier circuit 15 is shared by two bit line pairs (BL1, $\overline{BL1}$) and (BL2, $\overline{BL2}$). In this type of DRAM, switch circuits 18a and 18b are formed between the bit line pairs and the sense amplifier circuit 15, so as to disconnect the bit line pairs from the sense amplifier circuit 15. Each of the switch circuits 18a and 18b is made up of two N-channel MOS transistors 19 and 20, and the gates of these MOS transistors 19 and 20 are controlled by switch control signals $\phi T1$ and $\phi T2$.

The switch circuits 18a and 18b selectively operate when the potential difference between the paired bit lines is amplified by the sense amplifier circuit 15 for data detection. When the potential difference between bit line pair BL1 and $\overline{BL1}$ is amplified, the two MOS transistors 19 and 20 of switch circuit 18a are turned on by switch control signal $\phi T1$. Likewise, when the potential difference between bit line pair BL2 and $\overline{BL2}$ is amplified, the two MOS transistors 19 and 20 of switch circuit 18b are turned on by switch control signal $\phi T2$.

In the DRAM depicted in FIG. 2, either signals whose levels are the same as that of an externally-applied power supply voltage or signals whose levels are temporarily raised to be higher than the level of the externally-applied power supply voltage by means of a known boot-strap circuit, are used not only as signals $\phi EQL1$ and $\phi EQL2$ but also as signals $\phi T1$ and $\phi T2$. The reason is that signals $\phi T1$ and $\phi T2$ must be high-level voltages when the MOS transistors 19 and 20 of switch circuits 18a and 18b are turned on. If signals $\phi T1$ and $\phi T2$ are not high-level voltages then, a potential difference is produced between the source and drain of each of MOS transistors 19 and 20, and the sensing margin is adversely affected thereby. To solve this problem, not only the voltages of signals $\phi EQL1$ and $\phi EQL2$ but also those of signals $\phi T1$ and $\phi T2$ are temporarily boosted by means of the boot-strap circuit.

In some cases, use is made of a semiconductor memory device (such as a DRAM) which employs an internal voltage-generating circuit for generating an internal voltage different from an externally-applied power supply voltage. As such an internal voltage-generating circuit, there is proposed a type which employs a charge pump circuit to generate a boosted voltage at all times. However, in the case where a voltage boosted by the charge pump circuit is used as an internal voltage, a very large capacitance must be connected to the output terminal of the internal voltage generating circuit, so as to absorb the voltage variations during operation.

SUMMARY OF THE INVENTION

The present invention has been developed in consideration of the above circumstances, and an object of the present invention is to provide a semiconductor memory device which enables easy control of the timing at which either an operation for equalizing potentials of bit lines or an operation for controlling the connection between the bit lines and a sense amplifier is performed, which ensures a high-speed operation, and which enables bit lines to be pre-charged to a predetermined potential level, as in the conventional art, without adversely affecting the sensing margin.

To achieve this object, the present invention provides a semiconductor semiconductor memory device comprising: first and second bit lines; a boosted voltage generating circuit for constantly generating a boosted voltage having a voltage level higher than a voltage level of a power supply voltage supplied to an input thereof; and a charging/ equalizing circuit, responsive to a charging/equalizing control signal having a first voltage level equal to the voltage level of the boosted voltage, for charging the first and second bit lines with a charging voltage, and for equalizing the first and second bit lines at the same equalized voltage level.

The present invention also provides a semiconductor memory device, comprising: first and second bit line pairs, each of the bit line pairs having first and second bit lines; a boosted voltage generating circuit for constantly generating a boosted voltage having a voltage level higher than a voltage level of a power supply voltage supplied to an input thereof; a sense amplifier for sensing and amplifying a potential difference between the first and second bit lines of the first and second bit line pairs; a first charging/equalizing circuit, responsive to a first charging/equalizing control signal having a first voltage level equal to the voltage level of the boosted voltage, for charging the first and second bit lines of the first bit line pair with a first charging voltage, and for equalizing the first and second bit lines of the first bit line pair at the same first equalized voltage level; a second charging/equalizing circuit, responsive to a second charging/equalizing control signal having a first voltage level equal to the voltage level of the boosted voltage, for charging the first and second bit lines of the second bit line pair with a second charging voltage, and for equalizing the first and second bit lines of the second bit line pair at the same second equalized voltage level; a first switch, responsive to a first switch control signal having a first voltage level equal to the voltage level of the boosted voltage, for selectively connecting the first bit line pair to the sense amplifier; and a second switch, responsive to a second switch control signal having a first voltage level equal to the voltage level of the boosted voltage, for selectively connecting the second bit line pair to the sense amplifier.

The present invention further provides a semiconductor memory device, comprising: first and second bit; memory cells connected to the first and second bit lines; word lines for selecting the memory cells in accordance with a word line driving signal; a boosted voltage generating circuit for constantly generating a boosted voltage having a voltage level higher than a voltage level of a power supply voltage supplied to an input thereof, a charging/equalizing circuit, responsive to a charging/equalizing signal, for charging the first and second bit lines with a charging voltage, and for equalizing the first and second bit lines at the same equalized voltage level; a level converting circuit for converting an input control signal at a first voltage level into a converted control signal at the voltage level of the boosted voltage, and for outputting the converted control signal as the charging/equalizing control signal; and a word line selecting/driving circuit, responsive to address signals for generating selection signals having a first voltage level equal to the voltage level of the boosted voltage, and for outputting the selection signals as the word line driving signals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed descrip-tion of the preferred embodiments given below, serve to explain the principles of the invention.

FIG. 13 is a circuit diagram showing a specific configuration of a word line-selecting circuit employed in the DRAM depicted in FIG. 11;

DETAILED DESCRIPTION OF THE PREFERRED EMBODIMENTS

Embodiments of the present invention will now be described with reference to the accompanying drawings.

Figure 1:
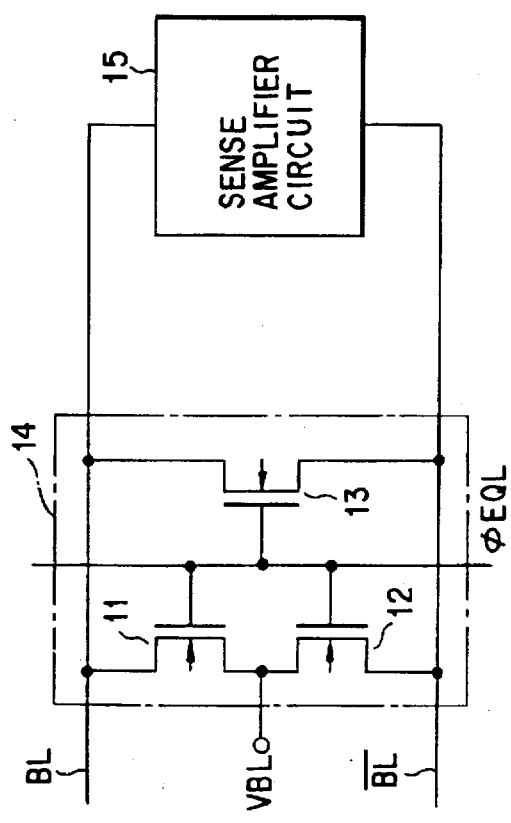
FIG. 1 is a circuit diagram showing part of a conventional DRAM.
Figure 3:
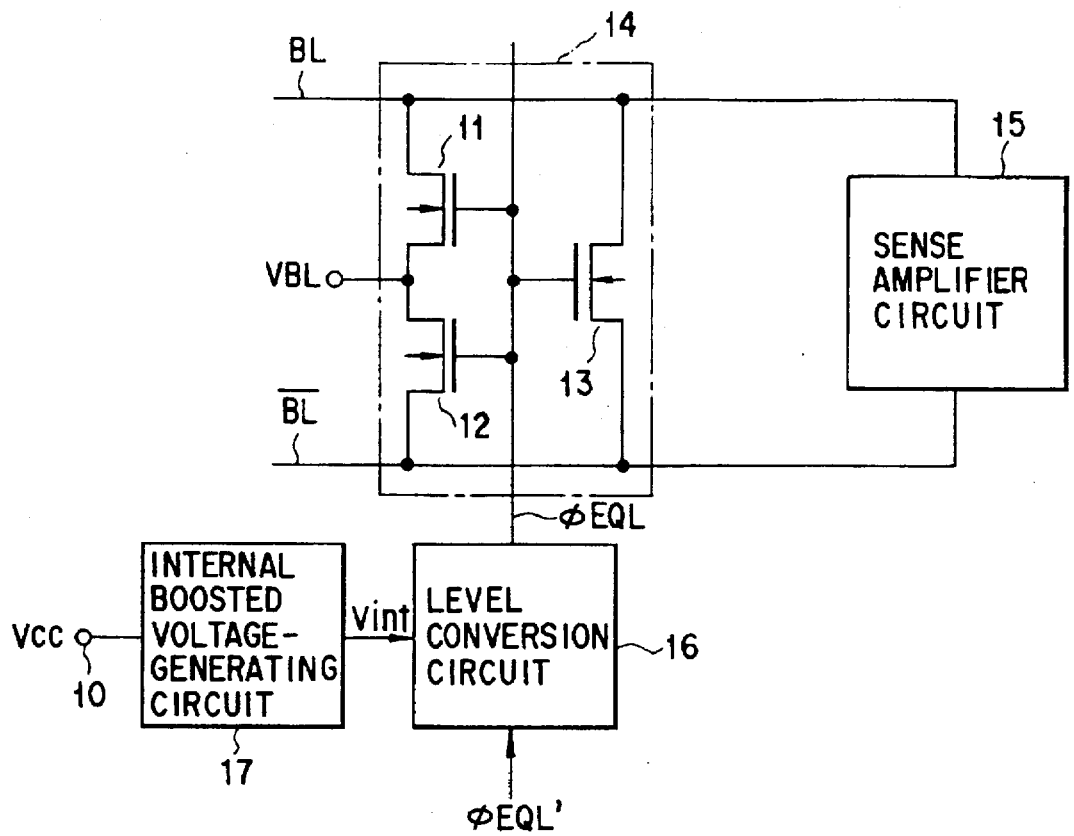
FIG. 3 is a circuit diagram showing part of a DRAM according to the first embodiment of the present invention.

FIG. 3 is a circuit diagram showing an equalizing circuit and its peripheral circuits and illustrating an application of the present invention to a DRAM. The DRAM is formed on a semiconductor substrate. In FIG. 3, the portions corresponding or similar to those of the prior art shown in FIG. 1 are denoted by the same reference numerals as used in FIG. 1.

As shown in FIG. 3, an equalizing circuit 14, made up of three N-channel MOS transistors 11, 12 and 13, is connected between a pair of bit lines BL and $\overline{BL}$. The source-drain path of MOS transistor 11 is connected between one of the bit lines (namely, bit line BL) and a node to which a pre-charging potential VBL is applied. The source-drain path of MOS transistor 12 is connected between the other one of the bit lines (namely, bit line $\overline{BL}$) and the node to which the pro-charging potential VBL is applied. The source-drain path of MOS transistor 13 is connected between the bit lines BL and $\overline{BL}$. An equalization control signal $\phi$EQL is supplied to the gates of the three MOS transistors 11, 12 and 13.

Although not shown, memory cells and dummy cells are connected to the bit lines BL and $\overline{BL}$. When data is read out, the memory cells and dummy cells are selected by word lines (not shown) and dummy word lines (not shown), and a potential corresponding to the storage data of a selected memory cell and a dummy memory cell is read out to the bit lines BL and $\overline{BL}$. It should be noted that the dummy memory cells and dummy word lines are not absolutely required.

A sense amplifier circuit 15 is connected to the bit lines BL and $\overline{BL}$. After data is read out, the sense amplifier circuit 15 amplifies the potential difference between the bit lines BL and $\overline{BL}$, so as to detect the data.

The equalization control signal $\phi$EQL is output from a level conversion circuit 16. An internal boosted voltage-generating circuit 17 constantly generates a boosted voltage Vint which is higher in level than the externally-applied power supply voltage Vcc applied to a power supply terminal 10. The boosted voltage Vint is applied to the level conversion circuit 16. The level conversion circuit 16 converts input control signal $\phi$EQL' (the high level voltage of which is equal to or lower than the externally-applied power supply voltage Vcc) into the boosted voltage Vint, thereby generating the equalization control signal $\phi$EQL. Therefore, the high-level voltage of the equalization control signal $\phi$EQL generated by the level conversion circuit 16 is as high as the boosted voltage Vint, and the low-level voltage thereof is a grounding voltage equal to input control signal $\phi$EQL'.

In the equalizing circuit 14, the three MOS transistors 11, 12 and 13 are turned on in response to the equalization control signal $\phi$EQL, and the bit lines BL and $\overline{BL}$ are pre-charged by the pre-charging potential VBL and are then short-circuited to each other to the same potential level. Since, at the time, the voltage of the equalization control signal $\phi$EQL is sufficiently higher than the externally-applied power supply voltage Vcc, no potential difference is produced between the source and drain of each of the MOS transistors 11, 12 and 13. Hence, the bit lines are set to have the predetermined pre-charging potential VBL. In this embodiment, the voltage of a signal need not be temporarily raised by means of a boot-strap circuit, as in the prior art. Therefore, complex timing control is not required.

After the equalizing operation by the equalizing circuit 14, a memory cell and a dummy memory cell are selected by a word line and a dummy word line, and the potential corresponding to the storage data of the selected memory cell and dummy memory cell is read out to the bit lines BL and $\overline{BL}$. After the data is read out, the sense amplifier circuit 15 amplifies the potential difference between the bit lines BL and $\overline{BL}$, so as to detect the data.

Figure 4:
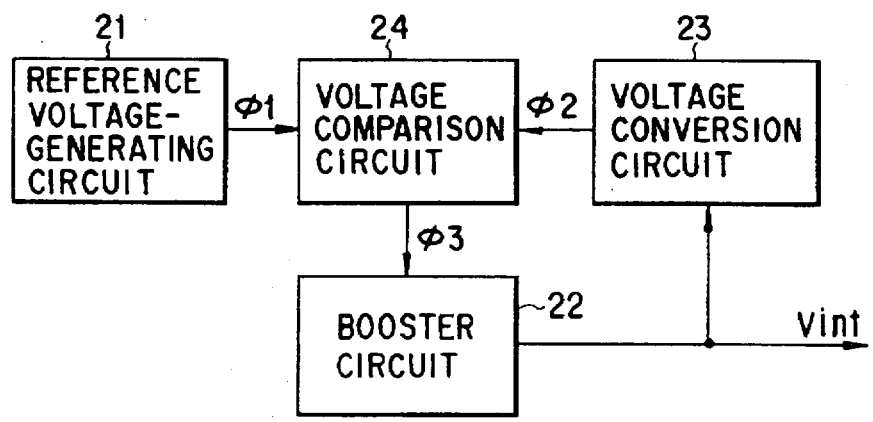
FIG. 4 is a block diagram showing the configuration of an internal boosted voltage-generating means used in the DRAM depicted in FIG. 3.

FIG. 4 is a block diagram showing the configuration of the internal boosted voltage-generating circuit 17 used for constantly generating a boosted voltage Vint which is higher in level than the externally-applied power supply voltage Vcc. The internal boosted voltage-generating circuit 17 is made up of: a reference voltage-generating circuit 21, a booster circuit 22, a voltage conversion circuit 23, and a voltage comparison circuit 24.

The reference voltage-generating circuit 21 generates a constant-value reference voltage $\phi$1 by utilization of the externally-applied power supply voltage Vcc. The booster circuit 22 generates a boosted voltage Vint which is higher than the externally-applied power supply voltage Vcc. The voltage conversion circuit 23 generates a voltage $\phi$2 which is lower than the boosted voltage Vint generated by the booster circuit 23, by utilization of the boosted voltage Vint. The voltage comparison circuit 24 compares the reference voltage $\phi$1 generated by the reference voltage-generating circuit 21 with the voltage $\phi$2 generated by the voltage conversion circuit 23, and produces a control signal $\phi$3 on the basis of the comparison. The control signal $\phi$3 is supplied to the booster circuit 22 to control the boosting operation.

In the internal boosted voltage-generating circuit 17, the booster circuit 22, the voltage conversion circuit 23 and the voltage comparison circuit 24 jointly form a closed loop. In accordance with this closed loop, the boosted voltage Vint is controlled to have a constant value which is proportional to the reference voltage $\phi$1.

Figure 5:
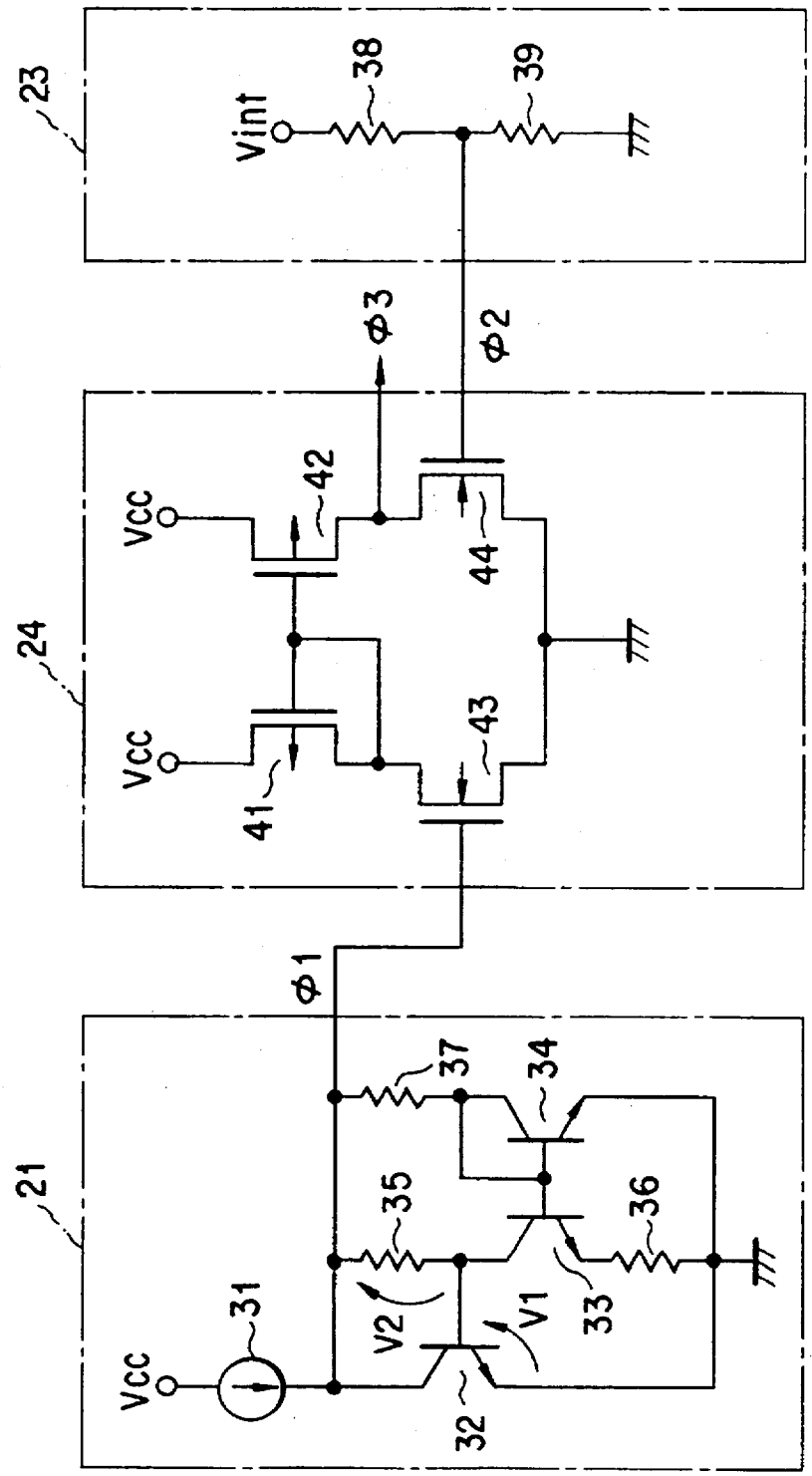
FIG. 5 is a circuit diagram showing detailed configurations of a reference voltage-generating circuit, a voltage conversion circuit and a voltage comparison circuit, which are included in the internal boosted voltage-generating circuit depicted in FIG. 4.

Each of the circuits of the internal boosted voltage-generating circuit 17 will be described in detail. FIG. 5 shows detailed configurations of the reference voltage-generating circuit 21, voltage conversion circuit 23 and voltage comparison circuit 24 of the internal boosted voltage-generating circuit 17.

The reference voltage-generating circuit 21 is a circuit for generating a voltage which has little voltage dependence on the externally-applied power supply voltage Vcc and which has little temperature dependency. Various types of circuits can be employed as the reference voltage-generating circuit 21, such as a band gap reference circuit using bipolar transistors, or a circuit for generating a substantially-constant voltage by means of MOS transistors having no implanted channel ions. In the circuit arrangement shown in FIG. 5, a band gap reference circuit is employed as the reference voltage-generating circuit 21. The reference voltage-generating circuit 21 depicted in FIG. 5 is made up of a constant current source 31, three NPN bipolar transistors 32, 33 and 34, and three resistors 35, 36 and 37. The reference voltage-generating circuit 21 produces a reference voltage $\phi$1 which is stable and has no temperature dependence by adding the emitter-base voltage V1 of a bipolar transistor having a negative temperature coefficient to the dropping voltage V2 appearing in resistor 35. Resistor 35 has a positive temperature coefficient and is formed by utilizing the fact that the temperature coefficient of the emitter-base voltage V1 varies in accordance with the current density of the emitter current of that bipolar transistor.

The voltage conversion circuit 23 is made up of two resistors 38 and 39 connected in series between a node to which the boosted voltage Vint is applied and a node to which the grounding potential is applied. The voltage obtained by the voltage conversion circuit 23 has a value corresponding to the resistance ratio of the two resistors 38 and 39.

The voltage comparison circuit 24 is a known type of voltage comparison circuit and includes two P-channel MOS transistors 41 and 42 and two N-channel MOS transistors 43 and 44. Voltages φ1 and φ2 described above are applied to the gates of the N-channel MOS transistors 43 and 44, respectively. Signal φ3 which is based on the levels of voltages φ1 and φ2 is output from the connection node located between MOS transistors 42 and 44.

Figure 6:
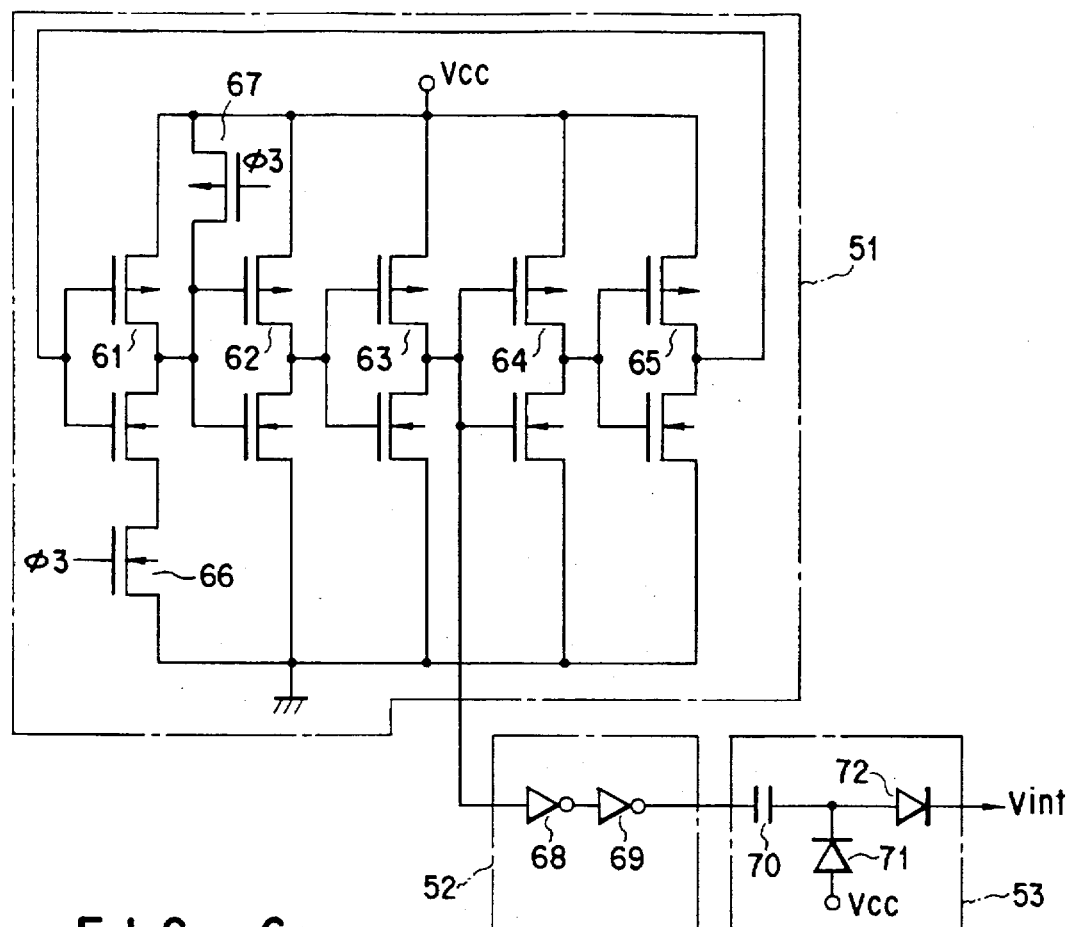
FIG. 6 is a circuit diagram showing a detailed configuration of a booster circuit included in the internal boosted voltage-generating circuit depicted in FIG. 4.

FIG. 6 shows a detailed configuration of the booster circuit 22 identified above. FIG. 6 shows a charge pump type booster circuit, although a variety of types of booster circuits may be utilized in the present invention. As shown, the charge pump type booster circuit is made up of a clock oscillator 51, a buffer circuit 52, and a charge pump circuit 53. The clock oscillator 51 shown in FIG. 6 is a 5 stage-ring oscillator, which is one of the simplest types of oscillators. The clock oscillator 51 comprises five CMOS inverters 61, 62, 63, 64 and 65 connected in multiple stages, and each of the CMOS inverters 61, 62, 63, 64 and 65 is made up of a P-channel MOS transistor and an N-channel MOS transistor. An output of the final-stage inverter 65 is fed back to the first-stage inverter 61. An N-channel MOS transistor 66, the gate of which is applied with the output signal φ3 of the voltage comparison circuit 24, has its source-drain path connected between the source of the N-channel MOS transistor of the first-stage inverter 61 and a node to which the ground potential is applied. A P-channel MOS transistor 67, the gate of which is applied with output signal φ3, has its source-drain path connected between a node to which the gates of the P- and N-channel MOS transistors of the second-stage inverter 62 are connected in common and a node to which the externally-applied power supply voltage Vcc is applied.

An output of an arbitrary-stage inverter, e.g., the third-stage inverter 63, is supplied to the buffer circuit 52. This buffer circuit 52 is made up of two inverters 68 and 69 connected in series, and an output of the buffer circuit 52 is supplied to the charge pump circuit 53. The charge pump circuit 53 is a known type of charge pump circuit and includes a capacitor 70, and two diodes 71 and 72. The two diodes 71 and 72 may be replaced with MOS transistors connected as diodes.

When, in the booster circuit of the above configuration, the output signal φ3 of the voltage comparison circuit 24 is "L" in level, the N-channel MOS transistor 66 connected to the first-stage inverter 61 of the clock oscillator 51 (FIG. 6) is in the OFF state. Since no current flows through the inverter 61, the clock oscillator 51 does not perform oscillation. At a time, the P-channel MOS transistor 67 connected to the second-stage inverter 62 is in the ON state, and the initial value of the signal input to the second-stage inverter 62 is set to be "H" in level.

The clock oscillator 51 starts operating when signal φ3 becomes "H" in level. To be more specific, when signal φ3 becomes "H" in level and the N-channel MOS transistor 66 is turned on, the first-stage inverter 61, to which the MOS transistor 66 is connected, is rendered operative. Since, at a time, the initial value of the input signal to the second-stage inverter 62 is "H" in level and the output signal from the final-stage inverter 65 is "H" in level, the output signal of the final-stage inverter 65 is supplied to the second-stage inverter 62 after being inverted. Since the P-channel MOS transistor 66, which is for setting the initial value, is in the OFF state then, input signals to the second-stage inverter 62 are sequentially inverted, thus causing an oscillation operation. Therefore, MOS transistor 66 serves as a switch for controlling the oscillation operation, and MOS transistor 67 serves as a switch for determining the initial value of each inverter when the oscillation operation stops. It should be noted that MOS transistor 67 is not absolutely required and can be omitted, if so desired.

The buffer circuit 52 is employed for producing a current which is sufficient for driving the capacitor 70 of the charge pump circuit 53 in response to the oscillation signal obtained by the clock oscillator 51.

In the charge pump circuit 53, diode 71 permits positive charge to be supplied from the node of the externally-applied power supply voltage Vcc to the capacitor 70 when the output signal from the buffer circuit 52 changes from "H" (i.e., the Vcc level) to "L" (i.e., the ground level), and prevents the flow of charge when the output signal from the buffer circuit 52 changes from "L" to "H". Likewise, diode 72 prevents the flow of charge from the node of voltage Vint when the output signal from the buffer circuit 52 changes from "H" to "L", and permits positive charge to flow to the node of voltage Vint when the output signal from the buffer circuit 52 changes from "L" to "H". Hence, positive charge flows from the node of voltage Vcc to the node of voltage Vint, with the result that voltage Vint becomes higher than voltage Vcc.

The charge pump circuit 53 shown in FIG. 6 is one of the simplest configurations. A boosted voltage may be generated by means of a charge pump circuit of another configuration. For example, a charge pump circuit controlled by a 2-phase clock signal may be employed.

Figure 7:
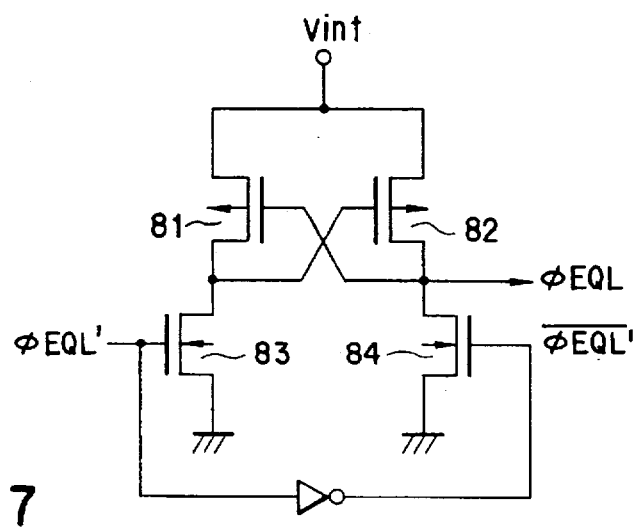
FIG. 7 is a circuit diagram showing a detailed configuration of a level conversion circuit employed in the DRAM depicted in FIG. 3.

FIG. 7 shows a detailed configuration of the level conversion circuit 16 depicted in FIG. 3. The level conversion circuit 16 is applied with the boosted voltage Vint as the power supply voltage. The level conversion circuit 16 comprises differential amplifiers, one of which is made up of two P-channel MOS transistors 81 and 82, and the other of which is made up of two N-channel MOS transistors 83 and 84. When control signal φEQL' (which is a signal before the level conversion) and an inverted signal $\overline{\phi EQL'}$ of control signal φEQL' are supplied to the gates of the N-channel MOS transistors 83 and 84, signal φEQL, the high-level voltage of which is level-shifted to the boosted voltage Vint is output from the connection node located between MOS transistors 82 and 84.

Figures 8A, 8B, 8C, 8D:
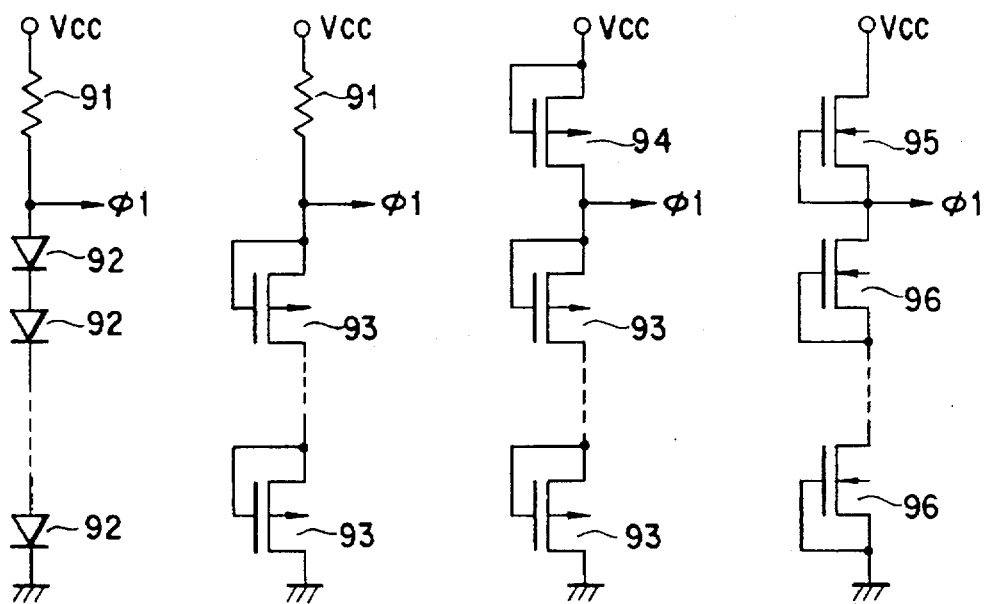
FIG. 8A is a circuit diagram showing a detailed configuration of the reference voltage-generating circuit of the internal boosted voltage-generating circuit depicted in FIG. 3.
FIG. 8B is a circuit diagram showing another detailed configuration of the reference voltage-generating circuit of the internal boosted voltage-generating circuit depicted in FIG. 3.
FIG. 8C is a circuit diagram showing still another detailed configuration of the reference voltage-generating circuit of the internal boosted voltage-generating circuit depicted in FIG. 3.
FIG. 8D is a circuit diagram showing still another detailed configuration of the reference voltage-generating circuit of the internal boosted voltage-generating circuit depicted in FIG. 3.

FIGS. 8A to 8D are circuit diagrams each showing a detailed configuration of the reference voltage-generating circuit 21, the configurations shown in FIGS. 8A to 8D being different from that depicted in FIG. 5. The circuit shown in FIG. 8A comprises a resistor 91 and n diodes 92. In the circuit shown in FIG. 8A, the value of voltage φ1 is determined by a voltage n times higher than the forward voltage Vf of each diode and the equivalent ON-state resistance of each diode. The circuit shown in FIG. 8B is obtained by replacing the diodes 92 depicted in FIG. 8A with P-channel MOS transistors 93 connected as diodes. In the case shown in FIG. 8B, the value of voltage φ1 is determined by a voltage n times higher than the threshold voltage Vth of each MOS transistor 93 and the equivalent ON-state resistance of each transistor. The circuit shown in FIG. 8C is obtained by replacing the resistor 91 depicted in FIG. 8B with a P-channel MOS transistor 94. The circuit shown in FIG. 8D is obtained by replacing P-channel MOS transistors 94 and 93 depicted in FIG. 8C with N-channel MOS transistors 95 and 96, respectively.

As described above, various circuit configurations can be adopted for the reference voltage-generating circuit 21. It should be noted that the reference voltage φ1 generated by the reference voltage-generating circuit 21 may be subjected to voltage conversion by a voltage conversion means of resistance division type, and a voltage obtained by the voltage conversion may be used as a reference voltage. This can be applied to the case of the above-mentioned voltage conversion circuit 23 as well.

When bit lines are pre-charged by means of the equalizing circuit 14 shown in FIG. 3, the gate capacitances of MOS transistors 11, 12 and 13 of the equalizing circuit 14 are connected to signal φEQL. In other words, the gate capacitances serve to suppress the potential variations of signal φEQL. Therefore, an additional capacitor need not be connected to the output terminal of the charge pump circuit 53, so as to suppress the potential variation of signal φEQL, and the chip size can be reduced accordingly.

Figure 9:
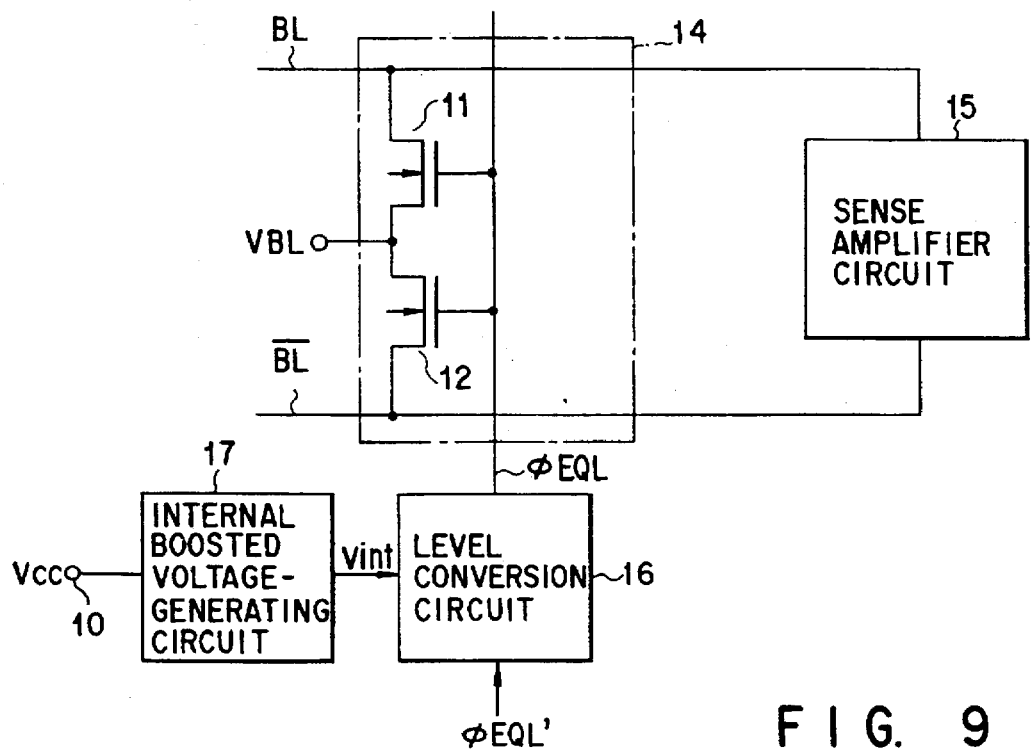
FIG. 9 is a circuit diagram showing part of a DRAM according to the second embodiment of the present invention.

FIG. 9 shows a DRAM according to the second embodiment of the present invention. The DRAM of the second embodiment differs from that of the embodiment shown in FIG. 3 in that the equalizing circuit 14 is made up of only two N-channel MOS transistors 11 and 12 (that is, N-channel MOS transistor 13 is not employed). In the equalizing circuit 14 of the configuration of the second embodiment, the two MOS transistors 11 and 12 are turned on in response to the equalization control signal φEQL, and the bit lines BL and $\overline{BL}$ are pre-charged in accordance with the pre-charging voltage VBL. Further, the potentials of the two bit lines are equalized by the MOS transistors 11 and 12.

As can be seen from the above, the MOS transistors 11 and 12 employed in the second embodiment have both a pre-charging function and an equalizing function. Not only in the first embodiment but also in the second embodiment, the voltage value of the equalization control signal φEQL is sufficiently higher than the externally-applied power supply voltage. Therefore, no potential difference is produced between the source and drain of each of the MOS transistors 11 and 12, and the bit line potentials can be set to the predetermined pre-charging potential VBL.

The second embodiment is advantageous in that one MOS transistor can be omitted from such an equalizing circuit 14 as employed in the embodiment shown in FIG. 3. Therefore, the chip size can be reduced at the time of integration.

Figure 2:
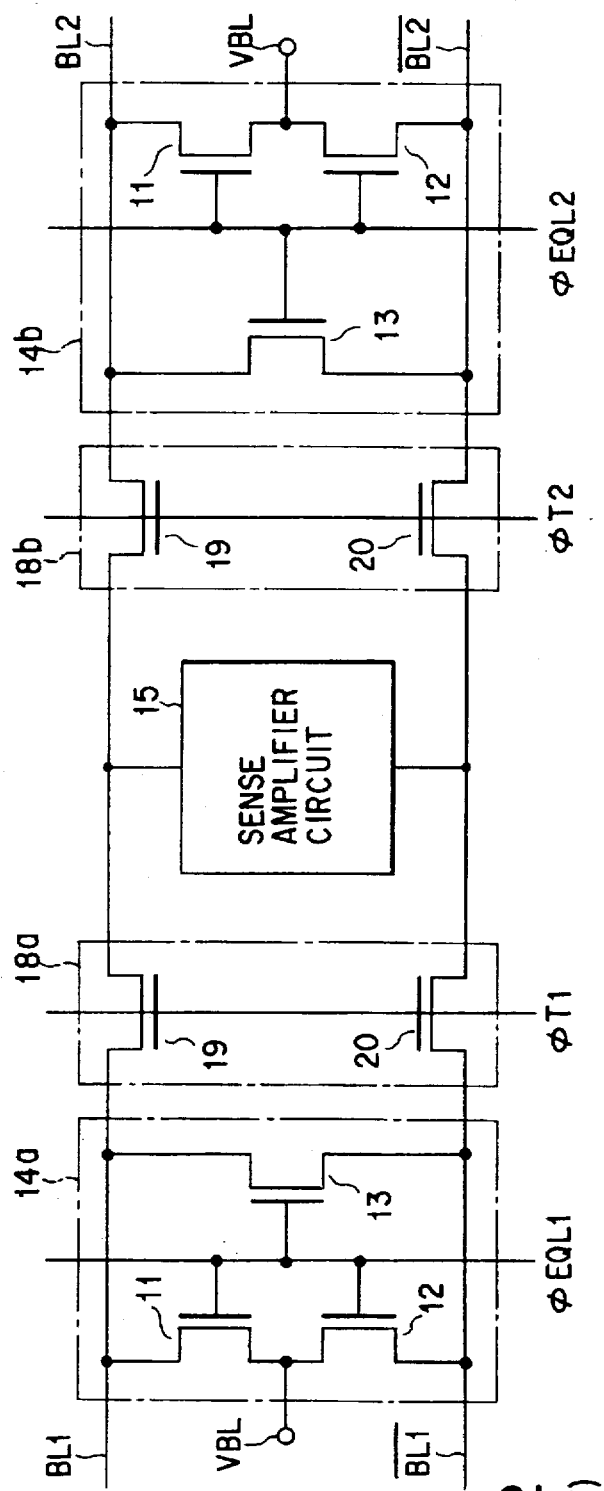
FIG. 2 is a circuit diagram showing part of a conventional shared sense amplifier type DRAM.
Figure 10:
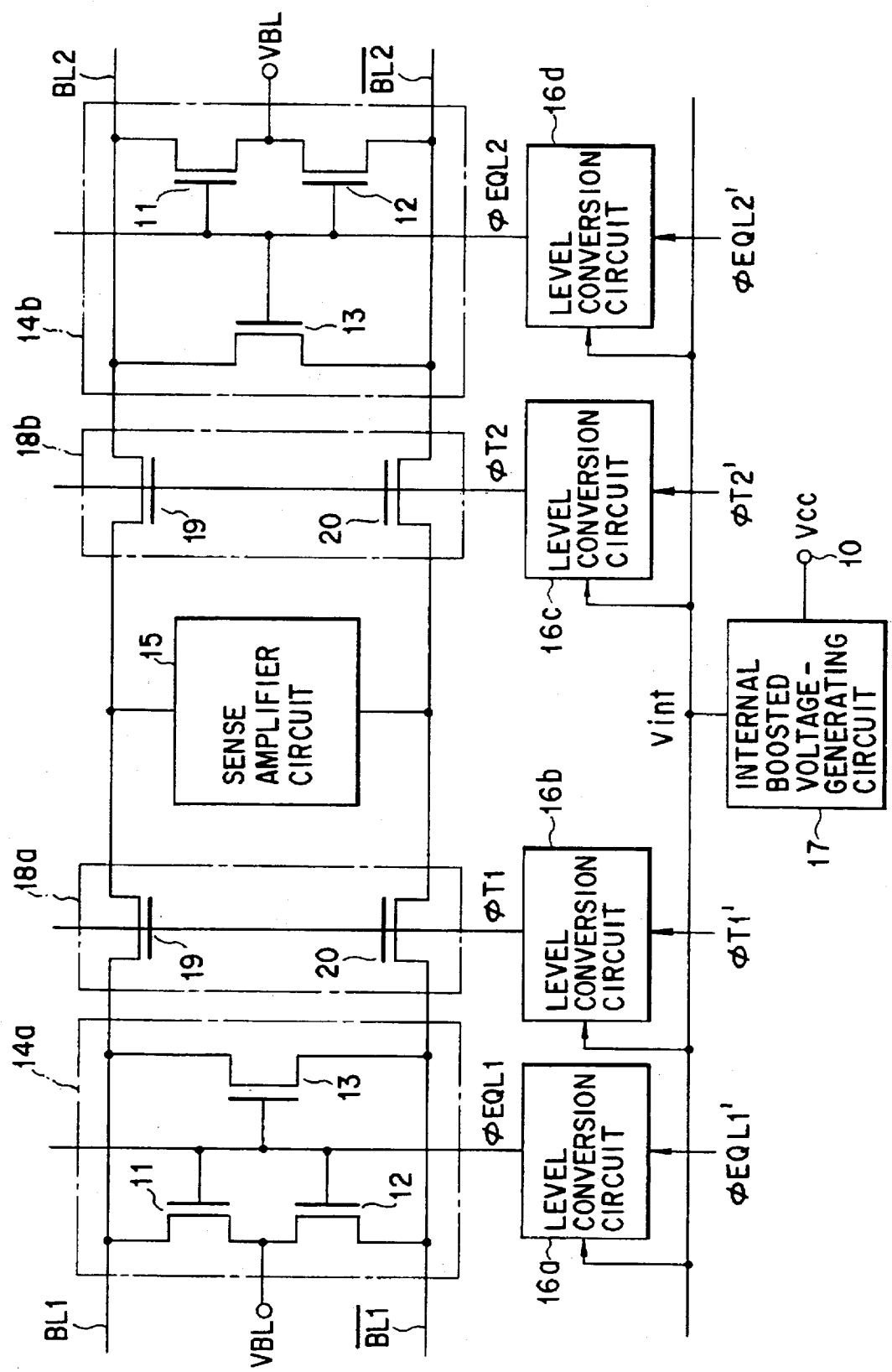
FIG. 10 is a circuit diagram showing part of a shared sense amplifier type DRAM according to the third embodiment of the present invention.

FIG. 10 shows the third embodiment of the present invention. In this embodiment, the present invention is applied to a shared sense amplifier type DRAM as is shown in FIG. 2. FIG. 10 shows equalizing circuits and their peripheral circuits. In FIG. 10, those circuit elements which correspond or are similar to those shown in FIG. 2 are denoted by the same reference numerals as used in FIG. 2, and a detailed description of such circuit elements will be omitted. The equalization control signals φEQL1 and φEQL2 and switch control signals φT1 and φT2, which are used in the DRAM of the third embodiment, are generated by level conversion circuits 16a, 16b, 16c and 16d. Each of these level conversion circuits 16a, 16b, 16c and 16d is applied with a boosted voltage Vint. The boosted voltage Vint is higher than the externally-applied power supply voltage Vcc and is constantly generated by an internal boosted voltage-generating circuit 17 of a similar circuit configuration to that shown in FIG. 4.

The level conversion circuits 16a, 16b, 16c and 16d respectively convert signals φEQL1', φT1', φT2' and φEQL2' (whose high-level voltages are equal in level to the externally-applied power supply voltage Vcc) into the boosted voltages Vint described above. By this conversion, equalization control signals φEQL1' and φEQL2' and switch control signals φT1' and φT2' are generated.

In the DRAM of the third embodiment, the bit lines can be set to the predetermined pre-charging level when the bit lines are pre-charged by means of the equalizing circuits 14a and 14b, as in the embodiment shown in FIG. 3. In addition, complex timing control is not required, as in the conventional case where the voltage of a signal is temporarily raised by means of a boot-strap circuit. Farther, since the DRAM of the third embodiment uses boosted voltages Vint as switch control signals φT1 and φT2, no potential difference is produced between the source and drain of each of the MOS transistors 19 and 20 of switch circuits 18a and 18b, when a sense amplifier circuit 15 performs data detection, with the MOS transistors 19 and 20 being ON. Hence, the sensing margin is not adversely affected.

The DRAM shown in FIG. 10 was described, referring to the case where both equalization control signals φEQL1, φEQL2 and switch control signals φT1, φT2 were generated by means of the level conversion circuits. Needless to say, however, either the equalization control signals φEQL1, φEQL2 or switch control signals φT1, φT2 may be generated by means of the level conversion circuits.

Figure 11:
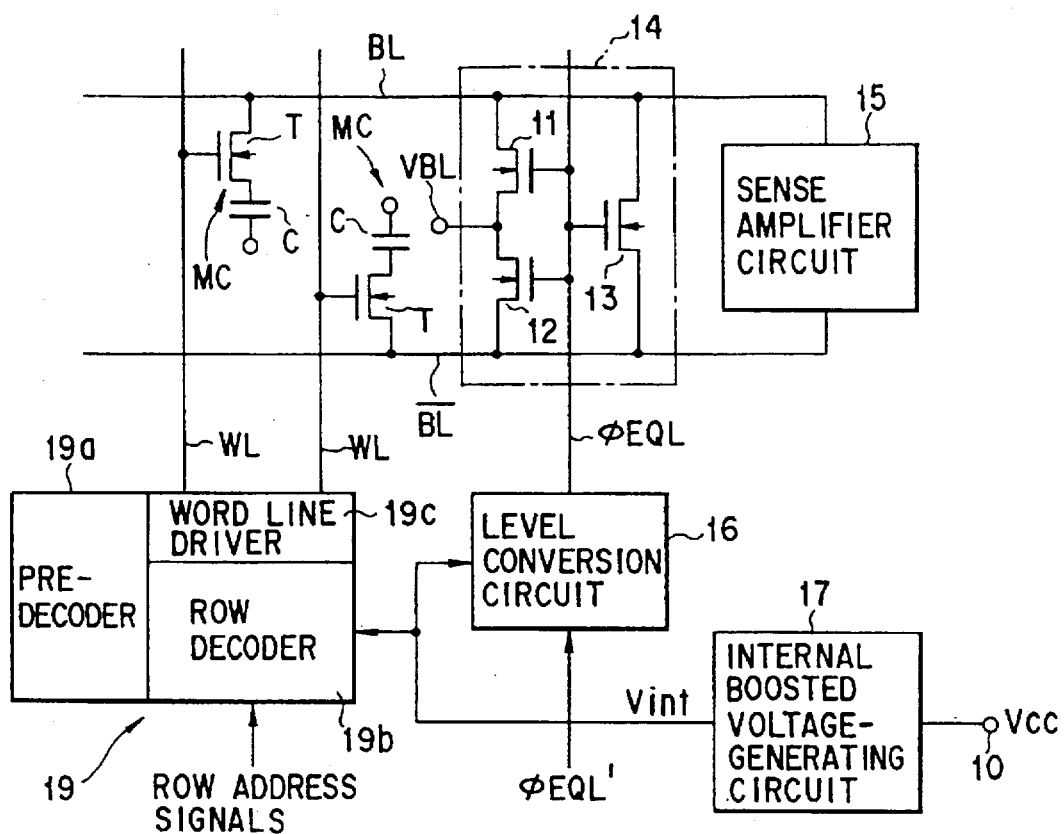
FIG. 11 is a circuit diagram showing part of a DRAM according to the fourth embodiment of the present invention.

FIG. 11 shows a DRAM according to the fourth embodiment of the present invention. Like the DRAMs described above, the DRAM of the fourth embodiment is formed on a semiconductor substrate. In FIG. 11, those circuit elements which correspond or are similar to those shown in FIG. 3 are denoted by the same reference numerals as used in FIG. 3, and a detailed description of such circuit elements will be omitted. Referring to FIG. 11, an equalizing circuit 14 is connected between a pair of bit lines BL and $\overline{BL}$. The equalizing circuit 14 is made up of three N-channel MOS transistors 11, 12 and 13, and each of the N-channel MOS transistors 11, 12 and 13 is controlled by an equalization control signal φEQL. Two memory cells MC are connected to the bit lines BL and $\overline{BL}$, respectively. Each of the memory cells MC is made up of a selecting transistor T and a charge storage capacitor C. At the time of reading out data, a memory cell is selected by a signal on one of word lines WL, and a potential corresponding to the charge stored in the capacitor of the selected memory cell MC is read out to either bit line BL or bit line $\overline{BL}$. The potential difference between the bit lines BL and $\overline{BL}$ is amplified by a sense amplifier circuit 15, for the detection of the data.

The equalization control signal φEQL is output from a level conversion circuit 16. An internal boosted voltage-generating circuit 17 constantly generates a boosted voltage Vint which is higher in level than the externally-applied power supply voltage Vcc, and the boosted voltage Vint is applied to the level conversion circuit 16. The level conversion circuit 16 converts signal φEQL' (the high-level voltage of which is equal to or lower than the externally-applied power supply voltage Vcc) into the boosted voltage Vint, thereby generating the equalization control signal φEQL. Therefore, the high-level voltage of the equalization control signal φEQL generated by the level conversion circuit 16 is as high as the boosted voltage Vint, and the low-level voltage thereof is a ground voltage equal to signal φEQL' (i.e., a signal which has not yet been converted).

A word line-selecting circuit 19 selects one of the word lines WL on the basis of row address signals. The word line-selecting circuit 19 is made up of a pre-decoder 19a, a row decoder 19b, and a word line driver 19c. The boosted voltage Vint generated by the internal boosted voltage-generating circuit 17 is applied to the word line-selecting circuit 19, and the high-level voltage of a signal supplied to the word line WL from the word line-selecting circuit 19 is equal to the boosted voltage Vint.

Figure 12:
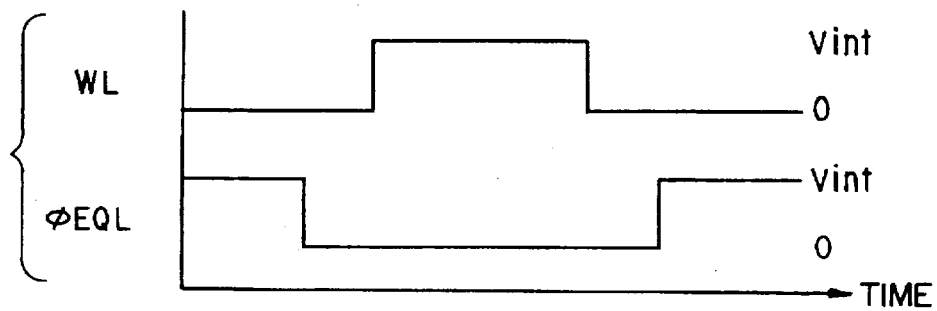
FIG. 12 is a timing chart showing one of the manners in which the DRAM depicted in FIG. 11 operates.

In the DRAM of the above configuration, the equalization control signal φEQL is made to become a high level before data is read out from a memory cell MC, as shown in the timing chart depicted in FIG. 12. The equalizing circuit 14 pre-charges the bit lines BL and $\overline{BL}$ and then short-circuits them to each other to the same potential level VBL. Since, at a time, the voltage of the equalization control signal φEQL is raised to the boosted voltage Vint and is sufficiently higher than the externally-applied power supply voltage Vcc, no potential difference is produced between the source and drain of each of the MOS transistors 11, 12 and 13 of the equalizing circuit 14. Hence, the bit lines are set to have the predetermined pre-charging potential VBL.

In the data readout operation which is subsequent to the bit line-equalizing operation, the word line-selecting circuit 19 selects and drives one of the word lines WL on the basis of row address signals, as shown in the timing chart of FIG. 12. At a time, the high-level voltage of a signal supplied to the selected word line WL is equal to the boosted voltage Vint generated by the internal boosted voltage-generating circuit 17. Therefore, the selecting transistor T of the selected memory cell MC is in the fully-conductive state, thus shortening the time required for reading out the charge from the capacitor C.

As described above, in the embodiment shown in FIG. 11, the boosted voltage Vint generated by the internal boosted voltage-generating circuit 17 is used by both the level conversion circuit 16 (which is for the equalization of the bit line potentials) and the word line-selecting circuit 19 (which is for the word line selection). As shown in FIG. 12, the period of time in which a word line WL is driven (i.e., the period of time in which the word line WL is at the high level) and the period of time in which the bit line potentials are equalized (i.e., the period of time in which signal φEQL is at the high level) do not overlap with each other. Therefore, the single internal boosted voltage-generating circuit 17 can be used in common by circuits 16 and 19.

FIG. 13 shows a detailed configuration of each of the pre-decoder 19a, row decoder 19b, and word line driver 19c of the word line-selecting circuit 19 employed in the DRAM depicted in FIG. 11. The pre-decoder 19a is made up of: a level shift circuit (LS) 111 for shifting the level of the high-level voltage of a pre-charging control signal $\overline{PRE}$ (which is derived from the node of voltage Vcc) to the level of the boosted voltage Vint; a P-channel MOS transistor 113 for controlling a pre-charge node 112 to have a pre-charging potential on the basis of an output from the level shift circuit 111; a number of decoding N-channel transistors 114, connected in series, for determining whether or not the pre-charge node 112 should be discharged, on the basis of some of the row address signals; and a CMOS inverter 115 for inverting the signal appearing at the pre-charge node 112.

The row decoder 19b is made up of: a level shift circuit (LS) 121 for shifting the level of the high-level voltage of a pre-charging control signal $\overline{PRE}$ (which is derived from the node of voltage Vcc) to the level of the boosted voltage Vint; a P-channel MOS transistor 123 for controlling a pre-charge node 122 to have a pre-charging potential on the basis of an output from the level shift circuit 121; a number of decoding N-channel transistors 124, connected in series, for determining whether or not the pre-charge node 122 should be discharged, on the basis of some of row address signals. The word line driver 19c is connected between the output terminal of the pre-decoder 19a and a node of ground potential. The word line driver 19c comprises a CMOS inverter 131 to which an output of the row decoder 19b is supplied.

The word line-selecting circuit of the above configuration operates as follows. When some of the row address signals supplied to the pre-decoder 19a satisfy a predetermined logical condition, the pre-decoder 19a outputs the boosted voltage Vint. This boosted voltage Vint is applied to the corresponding word line WL by way of the word line driver 19c when remain of the row address signals supplied to the row decoder 19b satisfy a predetermined logical condition. In this manner, memory cell MC is selected.

Figure 14:
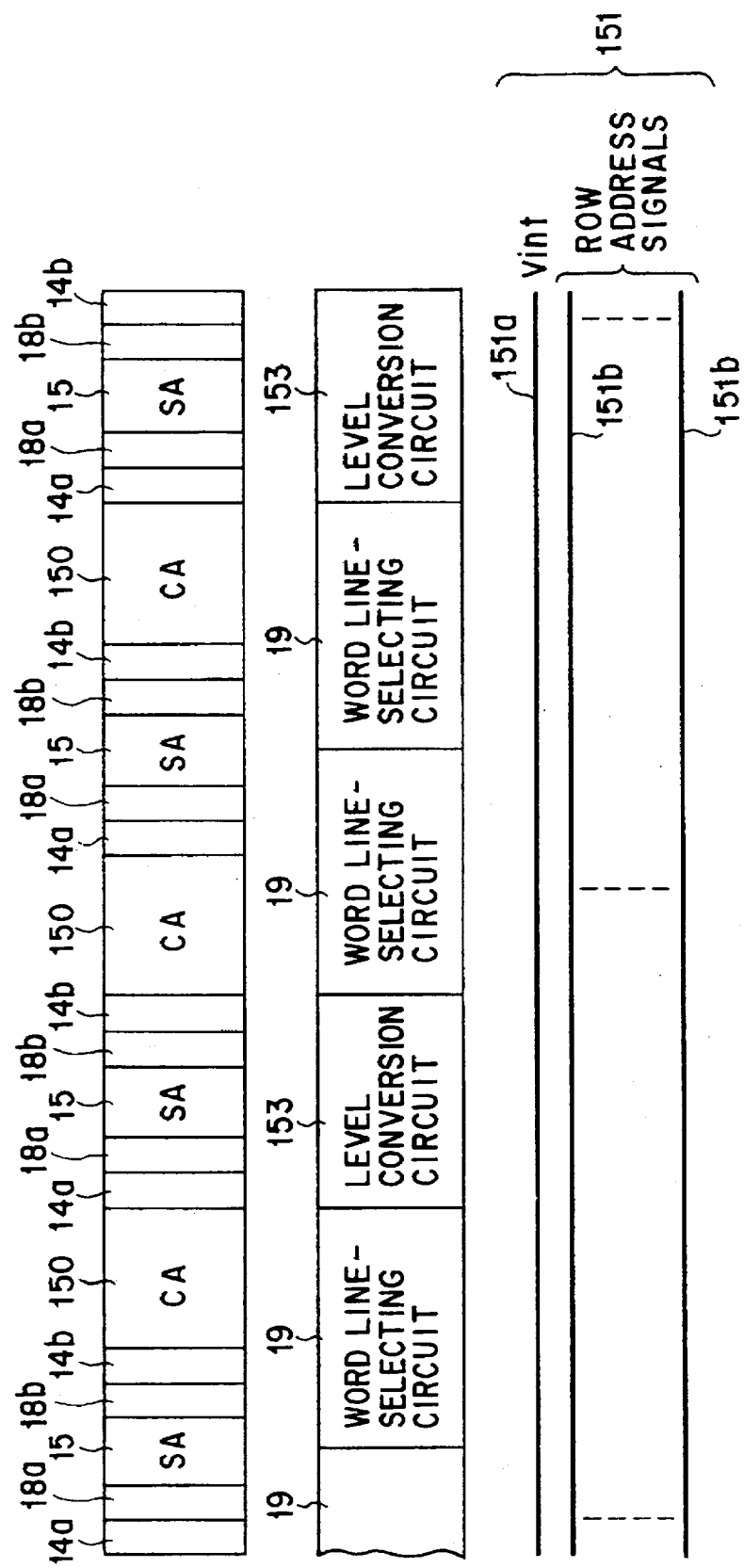
FIG. 14 shows how the circuits of the DRAM depicted in FIG. 11 are arranged with reference to a semiconductor substrate.

FIG. 14 shows how the circuit elements of the DRAM shown in FIG. 11 are arranged on a semiconductor substrate. Referring to FIG. 14, memory cells, each made up of a selecting transistor and a capacitor, are grouped into a number of memory cell arrays (CA) 150. The memory cell arrays 150 are arranged in one line. Equalizing circuit 14a and switch circuit 18a are located on one side of each memory cell array 150, and equalizing circuit 14b and switch circuit 18b are located on the other side. A sense amplifier (SA) 15 is located between the adjacent memory cell arrays 150. A group of wiring lines 151, including a wiring line 151a to which the boosted voltage Vint is applied and a number of wiring lines 151b to which row address signals are supplied, extend parallel to one another in the direction in which the memory cell arrays 150, sense amplifier circuits 15, equalizing circuits 14a, 14b, and switch circuits 18a, 18b are arranged. Level conversion circuits 153, including the level conversion circuits 16a to 16c described above, and the word line-selecting circuits 19 are arranged in one line such that they are located between the group 151 of wiring lines and the arrangement of the memory cell arrays 150, sense amplifiers 15, equalizing circuits 14a, 14b, and switch circuits 18a, 18b.

Figure 15:
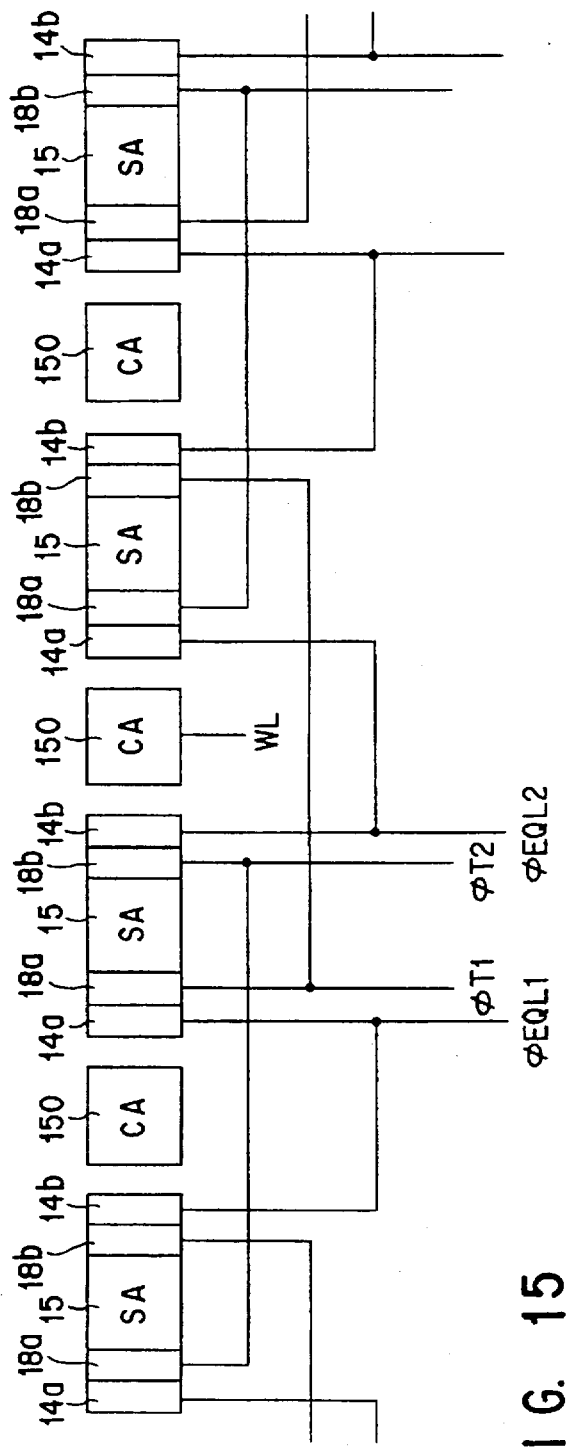
FIG. 15 shows one of the manners in which output signals from the level conversion circuit depicted in FIG. 14 are produced.
Figure 16:
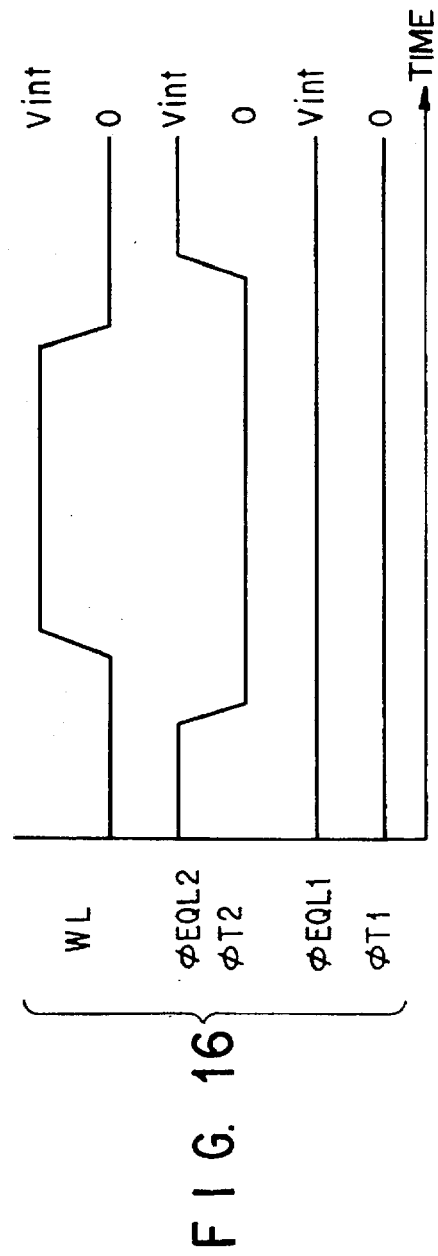
FIG. 16 is a timing chart of the signals indicated in FIG. 15.

In the DRAM shown in FIG. 14, the memory cell arrays 150, the level conversion circuits 153 and the word line-selecting circuits 19 are arranged adjacent to the group 151 of wiring lines, including the wiring line 151a to which the boosted voltage Vint is applied. The sources of the P-channel MOS transistors of these circuits are applied with the boosted voltage Vint. In order to permit a forward current to flow through the PN junctions formed by the sources and back gates of the P-channel MOS transistors, it is necessary to apply the boosted voltage Vint to N-wells of the P-channel MOS transistors. Since, in the DRAM shown in FIG. 14, the memory cell arrays 150, the level conversion circuits 153 and the word line-selecting circuits 19 are arranged adjacent to the group 151 of wiring lines, a single N-well can be used for the P-channel MOS transistors, and the boosted voltage Vint can be applied to this single N-well. Accordingly, the chip size can be small in comparison with the case where a number of N-wells must be provided. FIG. 15 shows one of the manners in which output signals φEQL1, φEQL2, φT1 and φT2 from one of the level conversion circuits 153 are produced in the DRAM shown in FIG. 14, and FIG. 16 is an example of a timing chart of output signals φEQL1, φEQL2, φT1 and φT2.

As described above, the semiconductor memory device of the present invention enables easy control of the timings at which either an operation for equalizing potentials of bit lines or an operation for controlling the connection between the bit lines and a sense amplifier is performed. In addition, the semiconductor memory device of the present invention ensures a high-speed operation. Further, the semiconductor memory device of the present invention enables bit lines to be pre-charged to a predetermined potential level, as in the conventional art, without adversely affecting the sensing margin.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
   first and second bit line pairs, each of said bit line pairs having first and second bit lines;
   a boosted voltage generating circuit, connected to a power supply voltage, for constantly generating a boosted voltage having a voltage level higher than a voltage level of said power supply voltage;
   a sense amplifier, connected to said first and second bit line pairs, for sensing and amplifying potential differences between the first and second bit lines of said first and second bit line pairs;
   a first charging/equalizing circuit, connected to the first and second bit lines of said first bit line pair, responsive to a first charging/equalizing control signal for charging the first and second bit lines of said first bit line pair with a first charging voltage, and for equalizing the first and second bit lines of said first bit line pair at the same first equalized voltage level;
   a first level converting circuit, connected to said first charging/equalizing circuit and to said boosted voltage generating circuit, for converting a first input control signal into a first converted control signal at the voltage level of the boosted voltage, and for outputting the first converted control signal as the first charging/equalizing control signal;
   a second charging/equalizing circuit, connected to the first and second bit lines of said second bit line pair, responsive to a second charging/equalizing control signal for charging the first and second bit lines of said second bit line pair with a second charging voltage, and for equalizing the first and second bit lines of said second bit line pair at the same second equalized voltage level;
   a second level converting circuit, connected to said second charging/equalizing circuit and to said boosted voltage generating circuit, for converting a second input control signal into a second converted control signal at the voltage level of the boosted voltage, and for outputting the second converted control signal as the second charging/equalizing control signal;
   a first switch, connected to said first bit line pair and to said sense amplifier, responsive to a first switch control signal having a switch control signal voltage level equal to the voltage level of the boosted voltage for selectively connecting said first bit line pair to said sense amplifier; and
   a second switch, connected to said second bit line pair and to said sense amplifier, responsive to a second switch control signal having a switch control signal voltage level equal to the voltage level of the boosted voltage for selectively connecting said second bit line pair to said sense amplifier.

2. The semiconductor memory device according to claim 1, wherein:
   said first charging/equalizing control signal is equalized to the voltage level of the boosted voltage when the first and second bit lines of said first bit line pair are being charged with the first charging voltage;
   said second charging/equalizing control signal is equalized to the voltage level of the boosted voltage when the first and second bit lines of said second bit line pair are being charged with the second charging voltage; and
   the first and second switch control signals are equalized to the voltage level of the boosted voltage during a period of time other than when the first and second bit lines of said first and second bit line pairs are being charged with the first and second charging voltages, respectively.

3. The semiconductor memory device according to claim 1, wherein said first charging/equalizing circuit includes:
   a first MOS transistor having a source-drain path connected between the first bit line of said first bit line pair and a first node which is supplied with the first charging voltage, and a gate which is supplied with the first charging/equalizing control signal;
   a second MOS transistor having a source-drain path connected between the second bit line of said first bit line pair and said first node, and a gate which is supplied with the first charging/equalizing control signal; and
   a third MOS transistor having a source-drain path connected between the first and second bit lines of said first bit line pair, and a gate which is supplied with the first charging/equalizing control signal; and
   wherein said second charging/equalizing circuit includes:
   a fourth MOS transistor having a source-drain path connected between the first bit line of said second bit line pair and a second node which is supplied with the second charging voltage, and a gate which is supplied with the second charging/equalizing control signal;
   a fifth MOS transistor having a source-drain path connected between the second bit line of said second bit line pair and said second node, and a gate which is supplied with the second charging/equalizing control signal; and
   a sixth MOS transistor having a source-drain path connected between the first and second bit lines of said second bit line pair, and a gate which is supplied with the second charging/equalizing control signal.

4. The semiconductor memory device according to claim 3, wherein said first, second, third, fourth, fifth and sixth MOS transistors have the same channel conductivity type.

5. The semiconductor memory device according to claim 1, wherein said boosted voltage generating circuit includes:
   a reference voltage generating circuit for generating a reference voltage;
   a boosting circuit responsive to a boosting circuit control signal for generating the boosted voltage by boosting the power supply voltage;
   a voltage converting circuit for converting the boosted voltage to a converted voltage having a voltage level lower than the voltage level of the boosted voltage; and
   a voltage comparing circuit for comparing the reference voltage and the converted voltage to generate a comparison signal, and for outputting the comparison signal as said boosting circuit control signal.

6. The semiconductor memory device according to claim 1, wherein said first charging/equalizing control signal has a second voltage level equal to a ground voltage and said second charging/equalizing control signal has a second voltage level equal to the ground voltage.

7. The semiconductor memory device according to claim 1, further comprising:
   a third level converting circuit, connected to said first switch and to said boosted voltage generating circuit, for converting a third input control signal into a third converted control signal at the voltage level of the boosted voltage, and for outputting the third converted control signal as the first switch control signal; and a fourth level converting circuit, connected to said second switch and to said boosted voltage generating circuit, for converting a fourth input control signal into a fourth converted control signal at the voltage level of the boosted voltage, and for outputting the fourth converted control signal as the second switch control signal.

8. A semiconductor memory device comprising:

first and second bit line pairs, each of said bit line pairs having first and second bit lines; a boosted voltage generating circuit, connected to a power supply voltage, for constantly generating a boosted voltage having a voltage level higher than a voltage level of said power supply voltage;

a sense amplifier, connected to said first and second bit line pairs, for sensing and amplifying potential differences between the first and second bit lines of said first and second bit line pairs;

a first charging/equalizing circuit, connected to the first and second bit lines of said first bit line pair, responsive to a first charging/equalizing control signal, for charging the first and second bit lines of said first bit line pair with a first charging voltage, and for equalizing the first and second bit lines of said first bit line pair at the same first equalized voltage level;

a second charging/equalizing circuit, connected to the first and second bit lines of said second bit line pair, responsive to a second charging/equalizing control signal, for charging the first and second bit lines of said second bit line pair with a second charging voltage, and for equalizing the first and second bit lines of said second bit line pair at the same second equalized voltage level;

a first switch, connected to said first bit line pair and to said sense amplifier, responsive to a first switch control signal for selectively connecting said first bit line pair to said sense amplifier;

a first level converting circuit, connected to said first switch and to said boosted voltage generating circuit, for converting a first input control signal into a first converted control signal at the voltage level of the boosted voltage, and for outputting the first converted control signal as the first switch control signal;

a second switch, connected to said second bit line pair and to said sense amplifier, responsive to a second switch control signal for selectively connecting said second bit line pair to said sense amplifier; and a second level converting circuit, connected to said second switch and to said boosted voltage generating circuit, for converting a second input control signal into a second converted control signal at the voltage level of the boosted voltage, and for outputting the second converted control signal as the second switch control signal.

9. A semiconductor memory device comprising:

a first memory cell array including a plurality of memory cells which are connected to first word lines and to first and second bit lines;

a first sense amplifier adjacent to said first memory cell array;

a second memory cell array adjacent to said first sense amplifier and including a plurality of memory cells which are connected to second word lines and to third and fourth bit lines;

a second sense amplifier adjacent to said second memory cell array;

a third memory cell array adjacent to said second sense amplifier and including a plurality of memory cells which are connected to third word lines and to fifth and sixth bit lines;

a first charging/equalizing circuit, located between said first memory cell array and said first sense amplifier and responsive to a first charging/equalizing signal, for charging the first and second bit lines in said first memory cell array with a first charging voltage and for equalizing the first and second bit lines at the same first equalized voltage level;

a first switch, located between said first charging/equalizing circuit and said first sense amplifier and responsive to a first switch control signal, for connecting said first and second bit lines in said first memory cell array to said first sense amplifier;

a second charging/equalizing circuit located between said second memory cell array and said first sense amplifier and responsive to a second charging/equalizing signal, for charging the third and fourth bit lines in said second memory cell array with a second charging voltage and for equalizing the third and fourth bit lines at the same second equalized voltage level;

a second switch, located between said second charging/equalizing circuit and said first sense amplifier and responsive to a second switch control signal, for connecting the third and fourth bit lines in said second memory cell array to said first sense amplifier;

a third charging/equalizing circuit located between said second memory cell array and said second sense amplifier and responsive to the second charging/equalizing signal, for charging the third and fourth bit lines in said second memory cell array with a third charging voltage and for equalizing the third and fourth bit lines at the same third equalized voltage level;

a third switch, located between said third charging/equalizing circuit and said second sense amplifier and responsive to a third switch control signal, for connecting the third and fourth bit lines in said second memory cell array to said second sense amplifier;

a fourth charging/equalizing circuit, located between said third memory cell array and said second sense amplifier and responsive to a third charging/equalizing signal for charging the fifth and sixth bit lines in said third memory cell array with a fourth charging voltage and for equalizing the fifth and sixth bit lines at the same fourth equalized voltage level; and a fourth switch, located between said fourth charging/equalizing circuit and said second sense amplifier and responsive to the first switch control signal, for connecting the fifth and sixth bit lines in said third memory cell array to said second sense amplifier, wherein, when data in the memory cells in said second memory cell array is read out, the word lines in said second memory cell array are selectively set at a high level and the first switch control signal is set at a low level, to bring said first and fourth switches into a non-conductive state, and at the same time the second charging/equalizing signal is set at a low level to bring said second and third charging/equalizing circuits into a disabled condition.

10. The semiconductor memory device according to claim 9, wherein, when data in the memory cells in said second memory cell array is read out, the second switch control signal is at a low level for rendering the second switch non-conductive and the third switch control signal is at a high level for rendering said third switch conductive.

11. The semiconductor memory device according to claim 9, further comprising:

a boosted voltage generating circuit, connected to a power supply voltage, for constantly generating a boosted voltage having a voltage level higher than a voltage level of said power supply voltage.

12. The semiconductor memory device according to claim 11, wherein the first, second, and third charging/equalizing signals each has a first level corresponding to the level of the boosted voltage.

13. The semiconductor memory device according to claim 11, further comprising:

a first level converting circuit, connected to said first charging/equalizing circuit and to said boosted voltage generating circuit, for converting a first input control signal into a first converted control signal at the voltage level of the boosted voltage, and for outputting the first converted control signal as the first charging/equalizing signal;

a second level converting circuit, connected to said second and third charging/equalizing circuits and to said boosted voltage generating circuit, for converting a second input control signal into a second converted control signal at the voltage level of the boosted voltage, and for outputting the second converted control signal as the second charging/equalizing signal; and a third level converting circuit, connected to said fourth charging/equalizing circuit and to said boosted voltage generating circuit, for converting a third input control signal into a third converted control signal at the voltage level of the boosted voltage, and for outputting the third converted control signal as the third charging/equalizing signal.

14. A semiconductor memory device comprising:

first and second bit line pairs, each of said bit line pairs having first and second bit lines;

a boosted voltage generating circuit, connected to a power supply voltage, for constantly generating a boosted voltage having a voltage level higher than a voltage level of said power supply voltage;

a sense amplifier, connected to said first and second bit line pairs, for sensing and amplifying potential differences between the first and second bit lines of said first and second bit line pairs;

a first charging/equalizing circuit, connected to the first and second bit lines of said first bit line pair, responsive to a first charging/equalizing control signal, for charging the first and second bit lines of said first bit line pair with a first charging voltage, and for equalizing the first and second bit lines of said first bit line pair at the same first equalized voltage level;

a first level converting circuit, connected to said first charging/equalizing circuit and to said boosted voltage generating circuit, for converting a first input control signal into a first converted control signal at the voltage level of the boosted voltage, and for outputting the first converted control signal as the first charging/equalizing control signal;

a second charging/equalizing circuit, connected to the first and second bit lines of said second bit line pair, responsive to a second charging/equalizing control signal, for charging the first and second bit lines of said second bit line pair with a second charging voltage, and for equalizing the first and second bit lines of said second bit line pair at the same second equalized voltage level;

a second level converting circuit, connected to said second charging/equalizing circuit and to said boosted voltage generating circuit, for converting a second input control signal into a second converted control signal at the voltage level of the boosted voltage, and for outputting the second converted control signal as the second charging/equalizing control signal;

a first switch, connected to said first bit line pair and to said sense amplifier, responsive to a first switch control signal for selectively connecting said first bit line pair to said sense amplifier; and a second switch, connected to said second bit line pair and to said sense amplifier, responsive to a second switch control signal for selectively connecting said second bit line pair to said sense amplifier.

15. A semiconductor memory device comprising:

first and second bit line pairs, each of said bit line pairs having first and second bit lines;

a boosted voltage generating circuit, connected to a power supply voltage, for constantly generating a boosted voltage having a voltage level higher than a voltage level of said power supply voltage;

a sense amplifier, connected to said first and second bit line pairs, for sensing and amplifying potential differences between the first and second bit lines of said first and second bit line pairs;

a first charging/equalizing circuit, connected to the first and second bit lines of said first bit line pair, responsive to a first charging/equalizing control signal, for charging the first and second bit lines of said first bit line pair with a first charging voltage, and for equalizing the first and second bit lines of said first bit line pair at the same first equalized voltage level;

a first level converting circuit, connected to said first charging/equalizing circuit and to said boosted voltage generating circuit, for converting a first input control signal into a first converted control signal at the voltage level of the boosted voltage, and for outputting the first converted control signal as the first charging/equalizing control signal;

a second charging/equalizing circuit, connected to the first and second bit lines of said second bit line pair, responsive to a second charging/equalizing control signal, for charging the first and second bit lines of said second bit line pair with a second charging voltage, and for equalizing the first and second bit lines of said second bit line pair at the same second equalized voltage level; and a second level converting circuit, connected to said second charging/equalizing circuit and to said boosted voltage generating circuit, for converting a second input control signal into a second converted control signal at the voltage level of the boosted voltage, and for outputting the second converted control signal as the second charging/equalizing control signal.

16. A semiconductor memory device comprising:

first and second bit line pairs, each of said bit line pairs having first and second bit lines;

a boosted voltage generating circuit, connected to a power supply voltage, for constantly generating a boosted voltage having a voltage level higher than a voltage level of said power supply voltage;

a sense amplifier, connected to said first and second bit line pairs, for sensing and amplifying potential differences between the first and second bit lines of said first and second bit line pairs;

a first switch, connected to said first bit line pair and to said sense amplifier, responsive to a first switch control signal for selectively connecting said first bit line pair to said sense amplifier;

a first level converting circuit, connected to said first switch and to said boosted voltage generating circuit, for converting a first input control signal into a first converted control signal at the voltage level of the boosted voltage, and for outputting the first converted control signal as the first switch control signal;

a second switch, connected to said second bit line pair and to said sense amplifier, responsive to a second switch control signal for selectively connecting said second bit line pair to said sense amplifier; and a second level converting circuit, connected to said second switch and to said boosted voltage generating circuit, for converting a second input control signal into a second converted control signal at the voltage level of the boosted voltage, and for outputting the second converted control signal as the second switch control signal.

* * * * *